(12) United States Patent
Kim

(10) Patent No.: US 7,638,430 B2
(45) Date of Patent: Dec. 29, 2009

(54) METHOD OF FORMING CONTACT PLUG OF SEMICONDUCTOR DEVICE

(75) Inventor: Jae Heon Kim, Cheorwon-gun (KR)

(73) Assignee: Hynix Semiconductor Inc., Icheon-si (KR)

( * ) Notice: Subject to any disclaimer, the term of this patent is extended or adjusted under 35 U.S.C. 154(b) by 1 day.

(21) Appl. No.: 12/163,901

(22) Filed: Jun. 27, 2008

(65) Prior Publication Data

US 2009/0068836 A1 Mar. 12, 2009

(30) Foreign Application Priority Data

Sep. 10, 2007 (KR) .................. 10-2007-0091510

(51) Int. Cl.
*H01L 21/44* (2006.01)
(52) U.S. Cl. .................. 438/652; 438/141; 438/180; 438/622; 438/626; 438/656; 257/500; 257/E21.66; 257/E21.678; 257/E21.683; 257/E21.691
(58) Field of Classification Search ......... 438/141–308, 438/584–688; 257/500, E21.66, 661, 678, 257/683, 691
See application file for complete search history.

(56) References Cited

U.S. PATENT DOCUMENTS

2006/0110874 A1* 5/2006 Kim .................. 438/209
2007/0281420 A1* 12/2007 Lai et al. ............ 438/253

* cited by examiner

*Primary Examiner*—Charles D Garber
*Assistant Examiner*—Yasser A Abdelaziez
(74) *Attorney, Agent, or Firm*—Townsend and Townsend and Crew LLP

(57) ABSTRACT

The present invention relates to a method of forming contact plugs of a semiconductor device. According to the method, a first insulating layer is formed over a semiconductor substrate in which a cell region and a peri region are defined and a first contact plug is formed in the peri region. The first insulating layer is etched using an etch process, thus forming contact holes through which junctions are exposed in the cell region and the first contact plug is exposed in the peri region. Second contact plugs are formed in the contact holes. The second contact plug formed within the contact hole of the peri region are removed using an etch process. A spacer is formed on sidewalls of the contact holes. Third contact plugs are formed within the contact holes.

12 Claims, 3 Drawing Sheets

METHOD OF FORMING CONTACT PLUG OF SEMICONDUCTOR DEVICE

CROSS-REFERENCES TO RELATED APPLICATION

The present application claims priority to Korean patent application number 10-2007-0091510, filed on Sep. 10, 2007, which is incorporated by reference in its entirety.

BACKGROUND OF THE INVENTION

The present invention relates to a semiconductor device and, more particularly, to a method of forming contact plugs of a semiconductor device, which can simplify the contact plug formation process and reduce the prime cost.

As devices are miniaturized below 60 nm, a problem arises with some of the photomask processes. When forming the drain contact plug of a cell region and the contact plug for a high voltage device of a peri (peripheral) region, these photomask processes cannot be performed at the same time.

This is because a drain contact hole and a contact hole for a high voltage device have different shapes and sizes. If a mask formation process is performed on the basis of any one region, mask patterns formed on the other region deviate from the specs, making it difficult to form the drain contact hole and the contact hole for a high voltage device with a desired size. The drain contact hole is gap-filled with a polysilicon layer and the contact hole for a high voltage device is gap-filled with a tungsten (W) layer. Therefore, the process of forming the drain contact plug and the process of forming the contact plug for a high voltage device cannot be performed at the same time.

As described above, the process of forming the drain contact plug and the process of forming the contact plug for a high voltage device are not performed at the same time, but separately carried out due to the mask formation process problem and a difference in materials for gap-filling the drain contact hole and the contact hole for a high voltage device. At this time, since the photomask process is performed under the ArF condition, subsequent processes are added. Accordingly, manufacturing costs for forming mask patterns are increased due to the added subsequent processes.

BRIEF SUMMARY OF THE INVENTION

The present invention relates to a method of forming contact plugs of a semiconductor device, in which mask formation processes for defining contact holes of a cell region and a peri region are performed at the same time and the contact holes of the cell region and the contact holes of the peri region are gap-filled with the same material, thus simplifying the process and reducing the prime cost.

According to a method of forming contact plugs of a semiconductor device in accordance with an aspect of the present invention, a first insulating layer is formed over a semiconductor substrate in which a cell region and a peri region are defined and a first contact plug is formed in the peri region. The first insulating layer is etched using an etch process, thus forming contact holes through which junctions are exposed in the cell region and the first contact plug is exposed in the peri region. Second contact plugs are formed in the contact holes. The second contact plug formed within the contact hole of the peri region are removed using an etch process. A spacer is formed on sidewalls of the contact holes. Third contact plugs are formed within the contact holes.

The first contact plug is formed from tungsten (W). The first insulating layer is formed from oxide material. Before forming the contact holes, a mask is formed on the first insulating layer by focusing on a drain contact hole size. The contact holes are formed using the mask. The contact hole formed in the peri region has a width wider than that of the contact hole formed in the cell region. The second contact plug is formed from polysilicon.

When removing the second contact plug formed within the contact hole of the peri region, the second contact plug formed within the contact hole of the cell region is partially removed. The spacer formation process includes forming a second insulating layer over the first insulating layer and the contact holes, and removing the second insulating layer on a top of the first insulating layer and at a bottom of the contact hole using an etch process, thus forming the spacer on the contact holes sidewalls.

The spacer is formed from nitride material. The spacer is formed thicker within the contact hole of the peri region than within the contact hole of the cell region. The third contact plug is formed from tungsten layer.

DESCRIPTION OF SPECIFIC EMBODIMENT

Figure 1A:
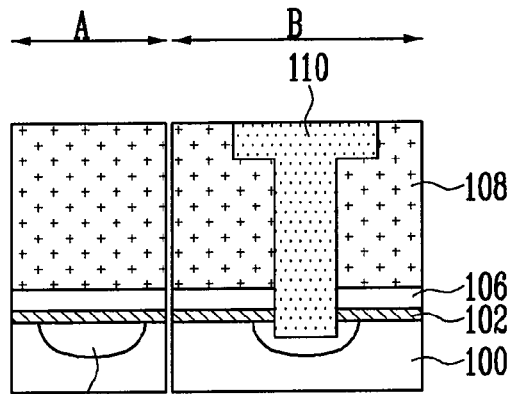
FIGS. 1A to 1I are cross-sectional views illustrating a method of forming contact plugs of a semiconductor device in accordance with an embodiment of the present invention.

A specific embodiment according to the present invention will be described with reference to the accompanying drawings. However, the present invention is not limited to the disclosed embodiment, but may be implemented in various ways. The embodiment is provided to complete the disclosure of the present invention and to allow those having ordinary skill in the art to understand the scope of the present invention. The present invention is defined by the category of the claims.

FIGS. 1A to 1I are cross-sectional views illustrating a method of forming contact plugs of a semiconductor device in accordance with an embodiment of the present invention. In the drawings, 'A' denotes a region in which drain contact plugs of a cell region are formed, and 'B' denotes a region in which contact plugs for low and high voltage devices, of a peri region, are formed.

Referring to FIG. 1A, there is provided a semiconductor substrate 100 in which a plurality of select lines (not shown), a plurality of word lines (not shown) and a plurality of gates (not shown) are formed. A buffer insulating layer 102 is formed on the semiconductor substrate 100 including the plurality of gates. An ion implantation process is performed to thereby form junctions 104 in the semiconductor substrate 100. The buffer insulating layer 102 is formed from oxide material.

A spacer (not shown) is formed on gate sidewalls. The spacer is formed from insulating material. Before the spacer is formed on the gate sidewalls, the buffer insulating layer 102 can be formed on the entire surface of the semiconductor substrate 100 in order to prevent the semiconductor substrate 100 from being damaged in an etch process for forming the spacer. A self-aligned contact (SAC) insulating layer 106 is formed over the semiconductor substrate 100, including the gates and the spacer. The SAC insulating layer 106 is formed from nitride material.

A first insulating layer 108 is formed on the SAC insulating layer 106 and a polishing process is then carried out. The first insulating layer 108 is formed from oxide material. The first insulating layer 108, the SAC insulating layer 106 and the buffer insulating layer 102 are etched using an etch process so that the junctions 104 are exposed, thus forming a first contact hole. The first insulating layer 108 in an upper region of the first contact hole is etched to thereby form a first trench. At this time, the first contact hole is formed in a source contact (not shown) region of the cell region A and a region of the peri region B, in which low and high voltage transistors are formed. Thus, a dual damascene pattern, comprised of the first contact hole and the first trench, is completed.

A first conductive layer is formed within the dual damascene pattern, thus forming a first contact plug 110. The first conductive layer is formed from tungsten (W). When forming the first contact plug 110, the source contact plug (not shown) is formed in the cell region A and a contact plug 110 for low and high voltage devices is formed in the peri region B.

Figure 1B:
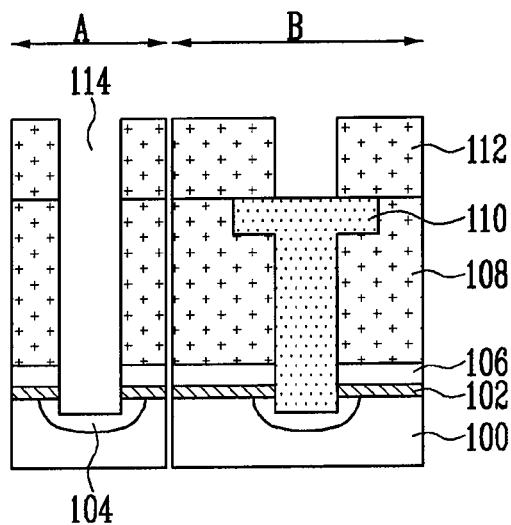

Referring to FIG. 1B, a second insulating layer 112, an amorphous carbon layer (not shown), a silicon oxynitride layer (not shown), a bottom anti-reflective coating (BARC) layer (not shown) and a photoresist pattern are formed over the first insulating layer 108 and the first contact plug 110. The photoresist pattern is formed under an ArF condition. The amorphous carbon layer, the silicon oxynitride layer and the BARC layer BARC function as a hardmask. The photoresist pattern is formed by forming a photoresist layer and then performing exposure and development processes. At this time, the exposure process is performed to define a contact hole to be formed subsequently and is performed on the basis of the size of a drain contact hole.

Next, the BARC layer and the silicon oxynitride layer are patterned using the photoresist pattern as an etch mask. The amorphous carbon layer is etched using the patterned silicon oxynitride layer as an etch mask. When the etch process is performed on the amorphous carbon layer, the photoresist pattern and the remaining BARC layer, if any, are removed. The second insulating layer 112 and the first insulating layer 108 are etched using the amorphous carbon layer as an etch mask, thus forming second contact holes 114. The etch process of the second insulating layer 112 and the first insulating layer 108 is performed using an etch gas, having a high etch selectivity for nitride materials to oxide materials, so that it is stopped at the SAC insulating layer 106. As the etch process is stopped at the SAC insulating layer 106 as described above, loss of the semiconductor substrate 100 can be minimized in a subsequent process for removing the SAC insulating layer 106.

When the etch process is performed on the second insulating layer 112 and the first insulating layer 108, a gas mixture of $C_4F_8$, $C_4F_6$, Ar and $O_2$, a gas mixture of $C_4F_6$, Ar and $O_2$, or a gas mixture of $C_4F_8$, Ar and $O_2$, having a high etch selectivity for nitride materials to oxide materials, may be used as the etch gas. Thus, etch selectivity for oxide materials can be 10 to 20 times faster than etch selectivity for nitride materials. In the cell region A, the second contact hole 114 is formed in the drain contact region and the region in which the source contact plug is formed and, in the peri region B, the second contact hole 114 is formed in the region in which the first contact plug 110 is formed, so that the first contact plug 110 is exposed. The second contact holes 114 are formed in the drain contact region of the cell region A and the region in which the source contact plug is formed and in the peri region B at the same time, by using the mask process as described above. At this time, in order to define the second contact holes 114, the exposure process is performed by focusing on the size of the drain contact hole and the photoresist pattern is then formed in the cell region A and the peri region B using a development process.

By performing the etch process using the photoresist pattern formed as described above, the second contact holes 114 can be formed simultaneously in the drain contact region and the region in which the source contact plug is formed, of the cell region A, and the peri region B. Since the second contact holes 114 is formed on the basis of the drain contact hole size, the size of the second contact hole 114 formed in the peri region B can be defined more greatly. Further, by forming the second contact holes 114 in the cell region A and the peri region B at the same time, the process can be simplified compared with forming the second contact holes 114 separately as in the prior art. After the etch process is performed on the second insulating layer 112 and the first insulating layer 108, the remaining silicon oxynitride layer and amorphous carbon layer, if any, are removed.

Next, the SAC insulating layer 106 is removed. When the etch process is performed on the SAC insulating layer 106, a gas mixture of $CF_4$, $CH_2F_2$, Ar and $O_2$, a gas mixture of $C_4F_6$, $CH_2F_2$, Ar and $O_2$ or a gas mixture of $C_4F_8$, $CH_2F_2$, Ar and $O_2$, which can etch nitride materials 10 to 20 times greater than the semiconductor substrate 100, is used in order to minimize loss of the semiconductor substrate 100.

Next, polymer, which is generated when the etch process for forming the second contact holes 114 is performed, is removed using a post etch treatment (PET) process. The surface of the semiconductor substrate 100 is oxidized. The surface of the semiconductor substrate 100, which has been oxidized by a wet cleaning process, is removed in order to expose a pure semiconductor substrate 100. Accordingly, contact resistance Rc can be improved.

Figure 1C:
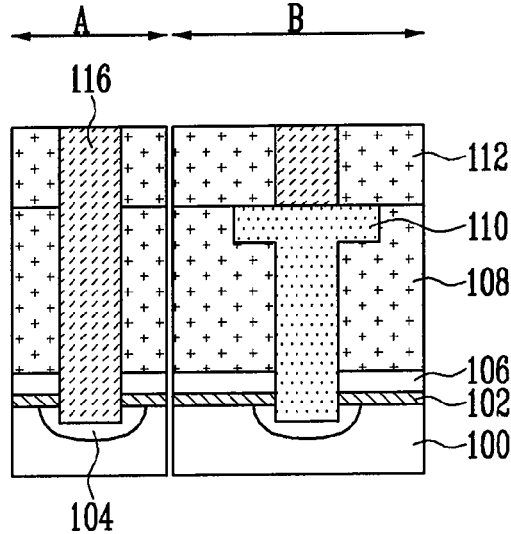

Referring to FIG. 1C, the second contact holes are gap-filled with a second conductive layer 116. The second conductive layer is formed of a polysilicon layer. The second conductive layer 116 is formed by performing a chemical mechanical polishing (CMP) until the second insulating layer 112 is exposed. The second conductive layer 116 becomes the drain contact plug in the cell region A and becomes the contact plug for the low and high voltage devices in the peri region B.

Figure 1D:
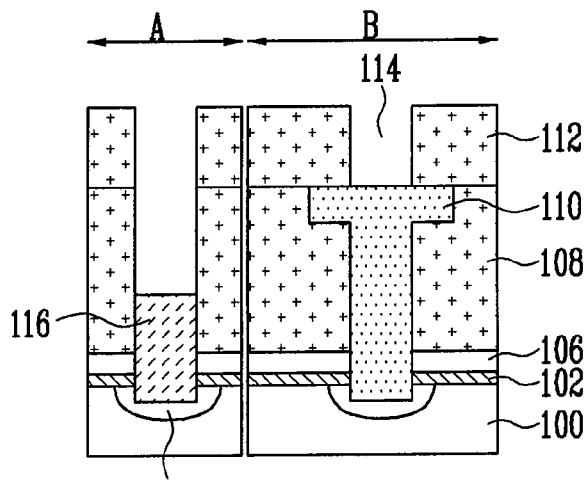

Referring to FIG. 1D, the second conductive layer 116 formed within the second contact hole 114 of the peri region B is removed using an etch process. The etch process is performed using a dry etchback process. When the second conductive layer formed within the second contact hole 114 of the peri region B is removed, the second conductive layer 116 formed within the second contact hole 114 of the cell region A is partially removed. Consequently, the second conductive layer 116 remains only at the bottom of the second contact hole 114 of the cell region A.

Figure 1E:
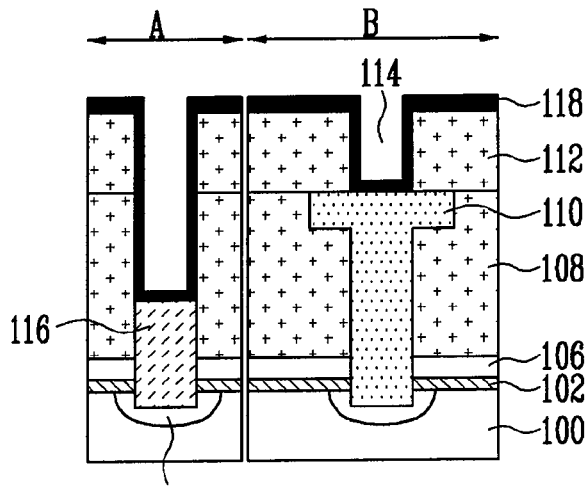

Referring to FIG. 1E, a third insulating layer 118 is formed on the second insulating layer 112 and the second contact holes 114. The third insulating layer 118 is formed from nitride material. The second contact hole 114 formed in the peri region B has a width wider than that of the second contact hole 114 formed in the cell region A and a depth shallower than that of the second contact hole 114 formed in the cell region A. Thus, the third insulating layer 118 is thicker in the second contact hole 114 of the peri region B than in the second contact hole 114 of the cell region A. The reason why the third insulating layer 118 is formed within the second contact holes 114 is to reduce the critical dimension (CD) of the second contact hole formed in the peri region B. In other words, the CD of the second contact hole formed in the peri region B has been increased because the mask formation process for defining the second contact holes 114 has been performed on the basis of the CD of the drain contact hole. By forming the third insulating layer 118 within the second contact holes 114, it can reduce the CD of the second contact hole 114 and also prevent bridges, which occur due to partial loss of the upper portion of the second insulating layer 112 in a subsequent web etch process.

Figure 1F:
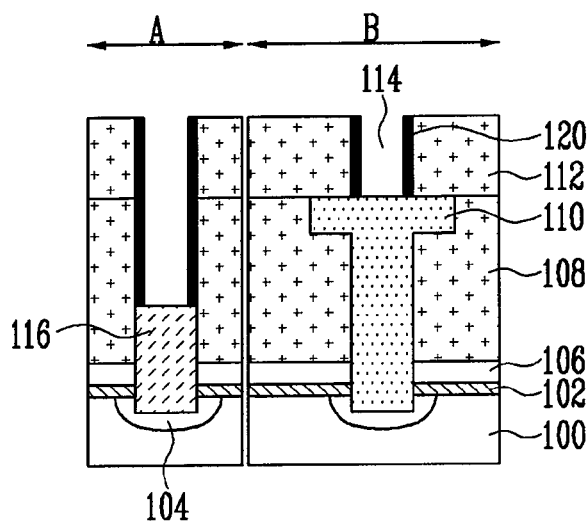

Referring to FIG. 1F, the third insulating layer formed on the top of the second insulating layer 112 and at the bottom of the second contact hole 114 is etched using an etch process, thus forming a spacer 120 on the sidewalls of the second contact hole 114. At this time, the second contact plug 116 and the first contact plug 110 are exposed due to the formation process of the spacer 120.

Figure 1G:
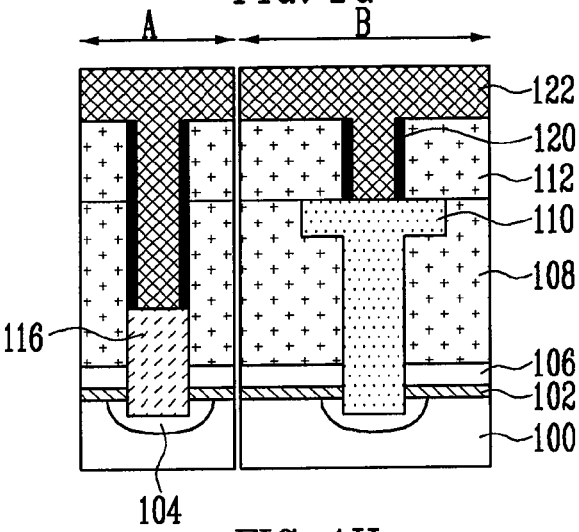

Referring to FIG. 1G, the second contact holes are gap-filled with a third conductive layer 122. The third conductive layer 122 is formed from tungsten (W). The second contact plug 116 formed from polysilicon is formed at the bottom of the second contact hole of the cell region A, so that the second contact plug 116 has a small depth when compared with the width of the second contact hole. Thus, although the second contact holes are gap-filled with the third conductive layer 122 [i.e., the tungsten (W) layer], the second contact holes can be fully gap-filled without voids.

Figure 1H:
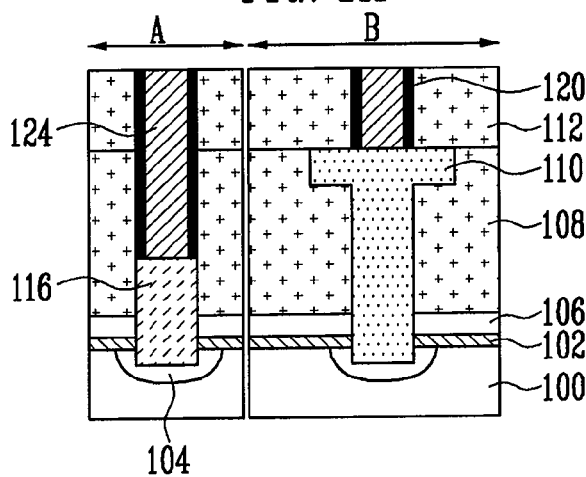

Referring to FIG. 1H, the third conductive layer is etched using a CMP process until the second insulating layer 112 is exposed, thereby forming a third contact plug 124. The spacer 120 is formed within the second contact holes, thus reducing the CD of the second contact holes. Accordingly, although the third contact plug 124 is formed, a bridge is not generated between the third contact plugs 124. Since the second contact holes of the cell region A and the peri region B are gap-filled with the same material (that is, the tungsten (W) layer), a mask process for gap-filling the second contact holes of the cell region A and the peri region B with different materials need not be used. Accordingly, the process can be simplified.

Figure 1I:
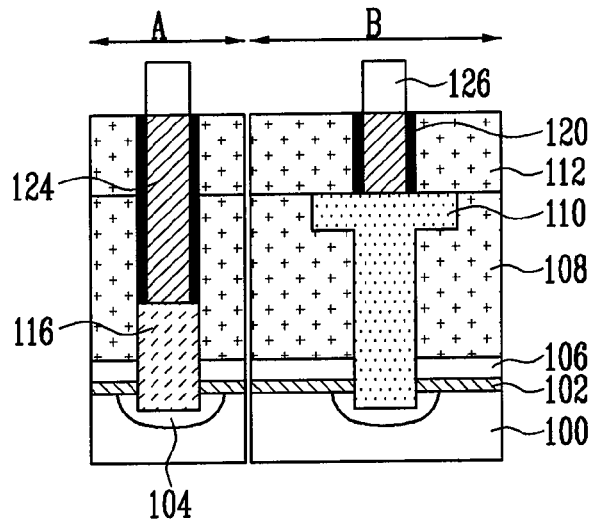

Referring to FIG. 1I, a metal line 126 is formed on the second insulating layer 112 and the third contact plug 124. The metal line 126 can be formed using a damascene method. For example, the metal line 126 can be formed as follows. A fourth insulating layer (not shown) is formed on the second insulating layer 112 and the third contact plug 124. The fourth insulating layer is etched using an etch process so that the third contact plug 124 is exposed, thus forming a second trench. The second trench is gap-filled with a fourth conductive layer, thus forming the metal line 126 connected to the third contact plug 124. At this time, the metal line 126 is formed from tungsten (W). The metal line 126 becomes a bit line in the cell region A. The spacer 120 is formed within the second contact holes in order to reduce the CD of the second contact holes. Accordingly, a bridge between t he metal line 126 and the third contact plug 124 can also be prevented.

As described above, the mask formation process for defining the second contact holes 114 of the cell region A and the peri region B is performed at the same time. Therefore, the manufacturing cost and the turn around time depending on the process proceeding can be reduced. Since the mask formation process for defining the second contact holes 114 is performed once, the formation process of the hardmask layer and the etch process can be performed at the same time.

The widening of the CD of the second contact hole 114 formed in the peri region B, when the second contact hole 114 is formed, can be prevented by the formation process of the spacer 120. Since the widening of the CD of the second contact hole 114 can be prevented by the spacer 120, a bridge between the third contact plugs 124 can be prevented. Further, the CD of the second contact hole 114 is reduced by forming the spacer 120 within the second contact hole 114. Therefore, a bridge between the metal line 126 and the third contact plug 124 can also be prevented.

Further, the second contact hole 114 of the cell region A and the second contact hole 114 of the peri region B are gap-filled with the same material. Accordingly, the process can be simplified.

As described above, the present invention has the following advantages.

First, a mask formation process for defining the second contact holes of the cell region and the peri region is performed at the same time. Accordingly, the manufacturing cost and the turning around time depending on the process proceeding can be reduced Second, since the mask formation process for defining the second contact holes is performed once, the formation process of the hardmask layer and the etch process can be performed at the same time.

Third, the widening of the CD of the second contact hole formed in the peri region, when the second contact hole, is formed can be prevented by the spacer formation process.

Fourth, since the widening of the CD of the second contact hole can be prevented by the spacer, a bridge between the third contact plugs can be prevented.

Fifth, the CD of the second contact hole is reduced by forming the spacer within the second contact hole. Accordingly, a bridge between the metal line and the third contact plug can be prevented.

Sixth, the second contact hole of the cell region and the second contact hole of the peri region are gap-filled with the same material. Accordingly, the process can be simplified.

Seventh, since the mask formation process for defining the second contact holes of the cell region and the peri region is performed at the same time and the second contact holes of the cell region and the second contact hole of the peri region are gap-filled with the same material, the process can be simplified and the prime cost can be reduced.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of forming contact plugs of a semiconductor device, comprising:
    forming a first insulating layer over a semiconductor substrate in which a cell region and a peri region are defined, the substrate having a first contact plug formed in the peri region;
    etching the first insulating layer to form contact holes through which junctions are exposed in the cell region and the first contact plug is exposed in the peri region;
    forming second contact plugs in the contact holes;
    removing the second contact plug formed within the contact hole of the peri region;
    forming a spacer on sidewalls of the contact holes; and
    forming third contact plugs within the contact holes.

2. The method of claim 1, wherein the first contact plug includes tungsten (W).

3. The method of claim 1, wherein the first insulating layer includes oxide material.

4. The method of claim 1, further comprising forming a mask on the first insulating layer by focusing on a drain contact hole size, before forming the contact holes.

5. The method of claim 4, wherein the contact holes are formed using the mask.

6. The method of claim 1, wherein the contact hole formed in the peri region has a width wider than that of the contact hole formed in the cell region.

7. The method of claim 1, wherein the second contact plug includes polysilicon.

8. The method of claim 1, wherein when removing the second contact plug formed within the contact hole of the peri region, the second contact plug formed within the contact hole of the cell region is partially removed.

9. The method of claim 1, wherein the forming-a-spacer step comprises:
   forming a second insulating layer over the first insulating layer and the contact holes; and
   removing a portion of the second insulating layer provided on top of the first insulating layer and a portion of the second insulating layer provided at a bottom of the contact hole, thus forming the spacer on the contact holes sidewalls.

10. The method of claim 1, wherein the spacer includes nitride material.

11. The method of claim 1, wherein the spacer is formed thicker within the contact hole of the peri region than within the contact hole of the cell region.

12. The method of claim 1, wherein the third contact plug includes tungsten layer.

* * * * *